(12) United States Patent
Kim et al.

(10) Patent No.: US 12,022,683 B2
(45) Date of Patent: Jun. 25, 2024

(54) DISPLAY PANEL AND MANUFACTURING METHOD THEREOF

(71) Applicant: LG DISPLAY CO., LTD., Seoul (KR)

(72) Inventors: Jinhyeon Kim, Paju-si (KR); Sunggoo Jung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 391 days.

(21) Appl. No.: 17/546,608

(22) Filed: Dec. 9, 2021

(65) Prior Publication Data
US 2022/0209194 A1 Jun. 30, 2022

(30) Foreign Application Priority Data

Dec. 31, 2020 (KR) .......................... 10-2020-0189302

(51) Int. Cl.
| | |
|---|---|
| *H10K 50/856* | (2023.01) |
| *H10K 50/824* | (2023.01) |
| *H10K 59/122* | (2023.01) |
| *H10K 59/126* | (2023.01) |
| *H10K 71/00* | (2023.01) |
| *H10K 59/12* | (2023.01) |
| *H10K 102/00* | (2023.01) |

(52) U.S. Cl.
CPC ......... *H10K 50/856* (2023.02); *H10K 50/824* (2023.02); *H10K 59/122* (2023.02); *H10K 59/126* (2023.02); *H10K 71/00* (2023.02); *H10K 59/1201* (2023.02); *H10K 2102/3026* (2023.02)

(58) Field of Classification Search
None
See application file for complete search history.

(56) References Cited

U.S. PATENT DOCUMENTS

2019/0296055 A1* 9/2019 Lius ..................... G06F 3/0421

FOREIGN PATENT DOCUMENTS

KR 2013-0039022 A 4/2013

OTHER PUBLICATIONS

Keita Umemoto et al, "Blackening of TFT Wiring by Depositing High Durability Film" Mitsubishi Materials Corporation Sanda Plant, Sanda-shi, Hyogoken, 669-1339, Japan, Keywords: TFT, Low reflectivity, Wiring, High durability. ISSN-L 1883-2490/26/ 0676 © 2019 ITE and SID, IDW'19 676-678.

* cited by examiner

*Primary Examiner* — Evren Seven
(74) *Attorney, Agent, or Firm* — POLSINELLI PC

(57) ABSTRACT

A display device includes a substrate which defines a light emitting area and an auxiliary electrode contact part and comprises a plurality of concave portions, a plurality of reflective layers which are disposed in the plurality of concave portions, respectively, an auxiliary electrode which is disposed to overlap with the auxiliary electrode contact part and is connected to a low potential driving power; an organic layer which covers the auxiliary electrode, and a cathode electrode which is formed on the organic layer and is in direct contact with the auxiliary electrode in the auxiliary electrode contact part, and at least one opening which is filled with the substrate and has at least one region overlapping with the auxiliary electrode contact part is formed between the plurality of reflective layers.

20 Claims, 15 Drawing Sheets

DISPLAY PANEL AND MANUFACTURING METHOD THEREOF

CROSS-REFERENCE TO RELATED APPLICATION

The present application claims the priority of Korean Patent Application No. 10-2020-0189302, filed on Dec. 31, 2020, which is hereby incorporated by reference in its entirety for all purposes.

BACKGROUND

Field of the Disclosure

The present disclosure relates to a display panel and a manufacturing method thereof.

Description of the Background

An organic light emitting device (hereinafter, referred to as a light emitting device) constituting the OLED emits light by itself without a separate light source, and thus, the OLED can be thinner and lighter. Also, the OLED shows high quality characteristics such as low power consumption, a high luminance, and fast response time, etc.

In general, the light emitting device has a structure in which an anode electrode, a bank surrounding the edge region of the anode electrode, a light emitting layer formed on the anode electrode within the bank, and the cathode electrode covering the light emitting layer and the bank are stacked. Such a light emitting device emits light with a required luminance by controlling the amount of current flowing through the light emitting device by a driving transistor.

SUMMARY

The present disclosure is to provide a display panel without an organic layer formed between an auxiliary electrode and a cathode electrode through a reflow process, and a manufacturing method thereof.

More specifically, the present disclosure is to provide a display panel which induces a partial reflow in the organic layer through a reflective layer, so that the auxiliary electrode and the cathode electrode are in direct contact with each other, and a manufacturing method thereof.

To achieve these and other advantages and in accordance with the purpose of the present disclosure, as embodied and broadly described, a display device includes a substrate which defines a light emitting area and an auxiliary electrode contact part and comprises a plurality of concave portions; a plurality of reflective layers which are disposed in the plurality of concave portions, respectively; an auxiliary electrode which is disposed to overlap with the auxiliary electrode contact part and is connected to a low potential driving power; an organic layer which covers the auxiliary electrode; and a cathode electrode which is formed on the organic layer and is in direct contact with the auxiliary electrode in the auxiliary electrode contact part. At least one opening which is filled with the substrate and has at least one region overlapping with the auxiliary electrode contact part is formed between the plurality of reflective layers.

The plurality of concave portions and the plurality of reflective layers are disposed in such a way as not to overlap with the auxiliary electrode contact part. A width of the opening is the same as a width of the auxiliary electrode contact part.

The plurality of concave portions and the plurality of reflective layers are disposed to overlap with a region of the auxiliary electrode contact part. A width of the auxiliary electrode contact part.

The cathode electrode is in direct contact with a central region of the auxiliary electrode.

The plurality of concave portions include first concave portions which are disposed in such a way as not to overlap with the auxiliary electrode contact part; and second concave portions which are disposed between the first concave portions and overlap with the auxiliary electrode contact part. The plurality of reflective layers include first reflective layers disposed within the first concave portions; and second reflective layers disposed within the second concave portions.

The cathode electrode is in direct contact with an edge region of the auxiliary electrode.

The display device further includes: a buffer layer which covers the plurality of reflective layers; at least one transistor which is formed on the buffer layer; and an overcoat layer which covers the at least one transistor and in which the auxiliary electrode is disposed.

The display device further includes a light shielding layer which is interposed between the substrate and the buffer layer and is disposed to overlap with the at least one transistor.

Another conductive layer is not interposed between the at least one opening and the auxiliary electrode.

The reflective layer is formed of silver or a multilayer including silver.

In another aspect of the present disclosure, a manufacturing method of the display device includes forming a plurality of concave portions on a substrate which defines an auxiliary electrode contact part; forming a plurality of reflective layers in the plurality of concave portions, respectively; forming an auxiliary electrode which is disposed to overlap with the auxiliary electrode contact part and is connected to a low potential driving power; forming an organic layer which covers the auxiliary electrode; forming a cathode electrode on the organic layer; and performing a reflow process by irradiating laser to an entire rear surface of the substrate. At least one opening which is filled with the substrate and has at least one region overlapping with the auxiliary electrode contact part is formed between the plurality of reflective layers.

A portion of the laser is reflected by the reflective layer and another portion of the laser passes through the at least one opening and reaches the auxiliary electrode.

At least a portion of the organic layer is melted by an energy of the laser which is transferred through the auxiliary electrode, and the melted organic layer flows on the auxiliary electrode.

The at least one opening overlaps with a central region of the auxiliary electrode. The melted organic layer flows to an edge region on the auxiliary electrode.

An upper portion of the central region of the auxiliary electrode is exposed by the flow of the organic layer. The cathode electrode is in direct contact with the exposed central region of the auxiliary electrode.

The at least one opening overlaps with an edge region of the auxiliary electrode. The melted organic layer flows to a central region on the auxiliary electrode.

An upper portion of the edge region of the auxiliary electrode is exposed by the flow of the organic layer. The cathode electrode is in direct contact with the exposed edge region of the auxiliary electrode.

The manufacturing method further includes, after the forming the plurality of reflective layers, forming a buffer layer which covers the plurality of reflective layers; forming at least one transistor on the buffer layer; and forming an overcoat layer which covers the at least one transistor.

The manufacturing method further includes, before the forming the buffer layer, forming, on the substrate, a light shielding layer which is disposed to overlap with the at least one transistor.

The reflective layer is formed of silver or a multilayer including silver.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
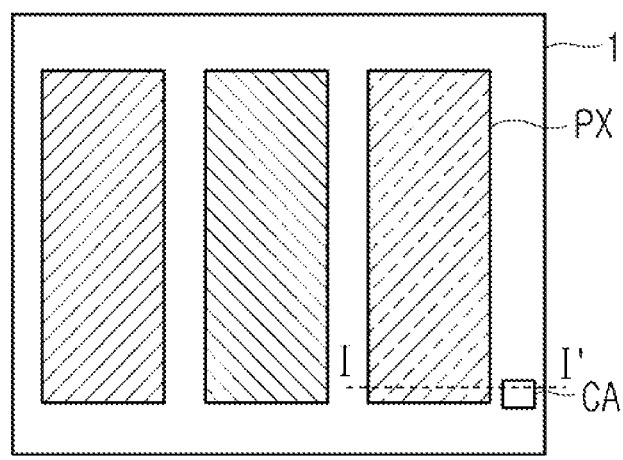
FIG. 1 is a plan view of a display panel according to the present disclosure.

Hereinafter, aspects of the present disclosure will be described with reference to the accompanying drawings. In this specification, when it is mentioned that a component (or region, layer, portion) "is on", "is connected to", or "is combined with" another component, terms "is on", "connected to", or "combined with" mean that a component may be directly connected to/combined with another component or mean that a third component may be disposed between them.

The same reference numerals correspond to the same components. Also, in the drawings, the thicknesses, ratios, and dimensions of the components are exaggerated for effective description of the technical details. A term "and/or" includes all of one or more combinations that related configurations can define.

While terms such as the first and the second, etc., can be used to describe various components, the components are not limited by the terms mentioned above. The terms are used only for distinguishing between one component and other components. For example, the first component may be designated as the second component without departing from the scope of rights of various aspects. Similarly, the second component may be designated as the first component. An expression of a singular form includes the expression of plural form thereof unless otherwise explicitly mentioned in the context.

Terms such as "below", "lower", "above", "upper" and the like are used to describe the relationships between the components shown in the drawings. These terms have relative concepts and are described based on directions indicated in the drawings.

In the present specification, it should be understood that the term "include" or "comprise" and the like is intended to specify characteristics, numbers, steps, operations, components, parts or any combination thereof described in the specification, and intended not to previously exclude the possibility of existence or addition of at least one another characteristics, numbers, steps, operations, components, parts or any combination thereof.

FIG. 1 is a plan view of a display panel according to the present disclosure.

Referring to FIG. 1, a plurality of sub-pixels PX are arranged on a display panel 1000 according to present disclosure. Each of the sub-pixels PX can represent one of red, green, and blue colors. Here, the three sub-pixels PX representing red, green, and blue colors can constitute one unit pixel.

The sub-pixels PX may be connected, through a contact hole formed in an auxiliary electrode contact part CA, to a power line to which a low potential driving voltage is applied. FIG. 1 shows an example in which one auxiliary electrode contact part CA is provided in a unit pixel. However, the present aspect is not limited thereto, and each of the sub-pixels PX can include the auxiliary electrode contact part CA.

Hereinafter, a more detailed structure of the sub-pixels PX will be described.

Figure 2:
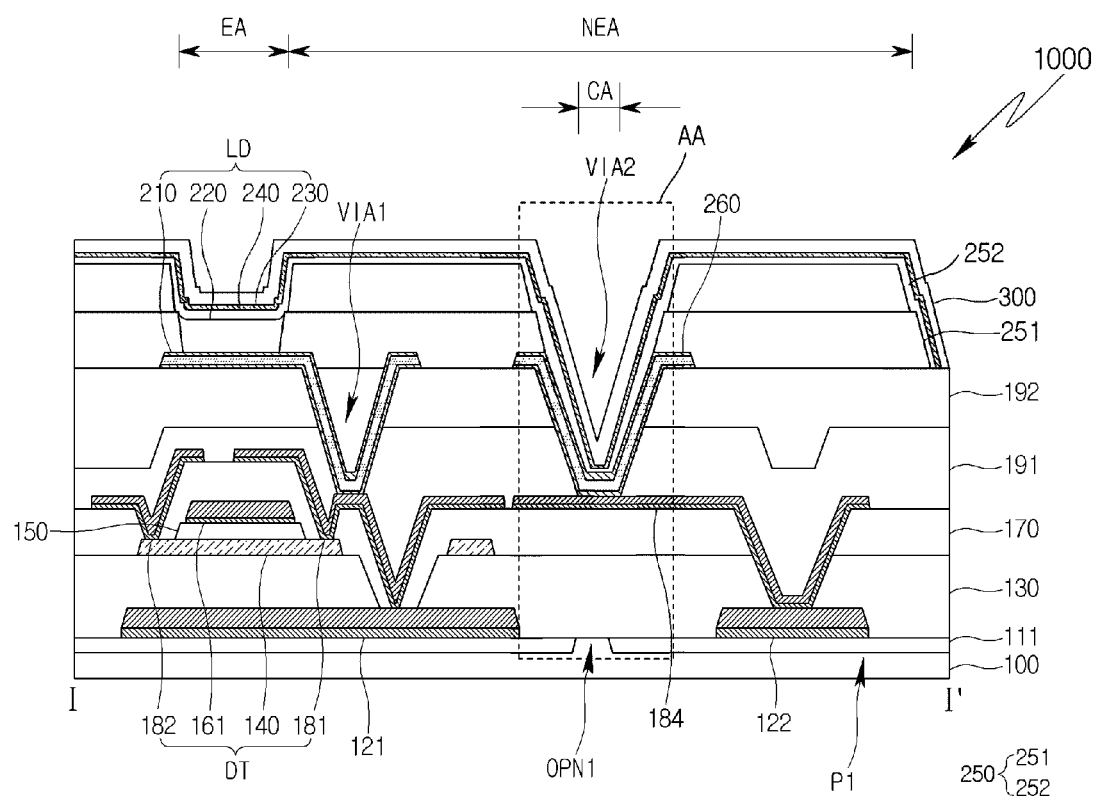
FIG. 2 is a schematic cross-sectional view of the display panel shown in FIG. 1 according to a first aspect of the present disclosure.
Figure 3:
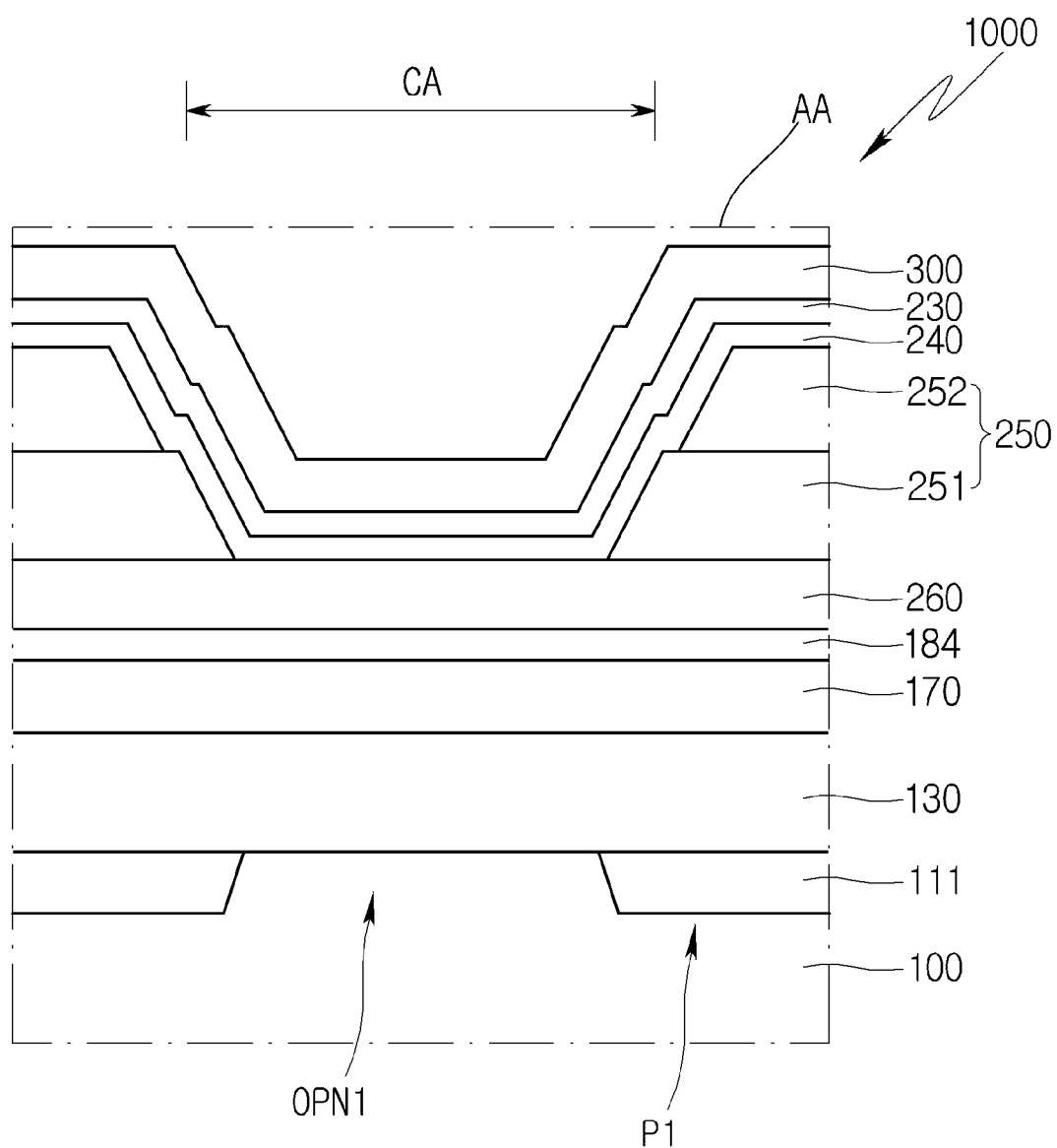
FIG. 3 is an enlarged view of area "AA" of FIG. 2 according to the present disclosure.

FIG. 2 is a schematic cross-sectional view of a display panel 1000 according to a first aspect of the present disclosure. FIG. 3 is an enlarged view showing schematically area "AA" of FIG. 2. Here, FIG. 3 is an enlarged view of area "AA" corresponding to the auxiliary electrode contact part CA.

Referring to FIG. 2, the display panel 1000 may include a substrate 100, a circuit element layer which is formed on the substrate 100 and includes at least one circuit element, and a light emitting device layer which includes a light emitting device LD.

The substrate 100 is a base material of the display panel 1000 and may be a light-transmitting substrate. The substrate 100 may be a rigid substrate including glass or tempered glass or a flexible substrate made of plastic. The substrate 100 may include a light emitting area EA and a non-light emitting area NEA. The non-light emitting area NEA includes the auxiliary electrode contact part CA in which direct contact is made between an auxiliary electrode 260 and a cathode electrode 230 of the light emitting device LD.

Referring to FIGS. 2 and 3 together, the substrate 100 may include a plurality of concave portions P1. In the first aspect, the concave portions P1 are formed in regions other than regions overlapping with the auxiliary electrode contact part CA. That is, the concave portions P1 may be entirely formed on the substrate 100 in such a way as not to overlap with the auxiliary electrode contact part CA. In this aspect, a spaced distance between the concave portions P1 is the same as or similar to the width of the auxiliary electrode contact part CA.

A reflective layer 111 is disposed in each of the concave portions P1. As in the concave portions P1, the reflective layers 111 are disposed in such a way as not to overlap with the auxiliary electrode contact part CA. In this aspect, an opening OPN1 filled with the substrate 100 is formed between the reflective layers 111. The opening OPN1 overlaps with the auxiliary electrode contact part CA, and the width of the opening OPN1 is the same as or similar to the width of the auxiliary electrode contact part CA. Another conductive layer is not interposed between the substrate 100 and the auxiliary electrode 260 in the region where the opening OPN1 is formed.

The reflective layer 111 may be formed of a material having a low absorptance for laser irradiated from the outside during a reflow process. That is, the reflective layer 111 may be formed of a material capable of reflecting laser.

The circuit element layer is formed on the substrate 100 and may include circuit elements (e.g., transistors, capacitors, etc.) and wirings which constitute the sub-pixel PX.

In the first aspect, a first conductive layer may be disposed on the substrate 100. The first conductive layer may include a light shielding layer 121 and an auxiliary wiring 122. The light shielding layer 121 is disposed to overlap with an active layer 140, in particular, a channel on a plane, thereby protecting an oxide semiconductor device from external light. The auxiliary wiring 122 may be connected to the power line to which the low potential driving voltage is applied.

A buffer layer 130 is disposed on the substrate 100 to cover the first conductive layer. The buffer layer 130 can prevent diffusion of ions or impurities from the substrate 100 and block moisture penetration.

The active layer 140 may be formed on the buffer layer 130. The active layer 140 may be formed of a silicon-based semiconductor material or an oxide-based semiconductor material. The active layer 140 may include a source region and a drain region which include p-type or n-type impurities, and a channel formed between the source region and the drain region.

A gate insulating layer 150 may be disposed to correspond to a region where a below-described gate electrode 161 is to be formed. For example, the gate insulating layer 150 may be formed on the channel of the active layer 140.

A second conductive layer may be disposed on the gate insulating layer 150. The second conductive layer may include the gate electrode 161. The gate electrode 161 may be disposed at a position corresponding to the channel of the active layer 140.

An interlayer insulating layer 170 may be formed on the second conductive layer. A third conductive layer may be formed on the interlayer insulating layer 170. The third conductive layer may include a source electrode 181 and a drain electrode 182. The source electrode 181 and the drain electrode 182 may be connected to the source region and the drain region of the active layer 140 respectively through a contact hole which passes through the interlayer insulating layer 170. The source electrode 181 and the drain electrode 182 may be formed as a single layer or multiple layers.

The source electrode 181, the drain electrode 182, the gate electrode 161, and the active layer 140 corresponding to them may constitute a transistor. In FIG. 2, a driving transistor in which the source electrode 181 is connected to an anode electrode 210 of the light emitting device LD is shown as an example.

The third conductive layer may further include a bridge electrode 184. The bridge electrode 184 is connected to the auxiliary wiring 122 through a contact hole which pass through the interlayer insulating layer 170 and the buffer layer 130.

The circuit element layer may be covered by a passivation layer 191 and an overcoat layer 192. The passivation layer 191 may be an insulating layer to protect the devices thereunder, and the overcoat layer 192 may be a planarization layer for reducing a step difference in the structure thereunder.

The light emitting device layer is formed on the overcoat layer 192 and includes the light emitting devices LDs. The light emitting device LD includes the anode electrode 210, a light emitting layer 220, and the cathode electrode 230.

The anode electrode 210 is formed on the overcoat layer 192. The anode electrode 210 is connected to the driving transistor DT through a first via hole VIA1 which passes through the overcoat layer 192 and the passivation layer 191. The anode electrode 210 may be formed of a transparent conductive material such as indium tin oxide (ITO), indium zinc oxide (IZO), zinc oxide (ZnO), etc. When the anode electrode 210 is a reflective electrode, the anode electrode 210 may be formed as a triple layer composed of a transparent conductive layer/a reflective layer (a metal oxide layer)/a transparent conductive layer. For example, the anode electrode 210 may be formed as a triple layer including ITO/Ag/ITO.

The auxiliary electrode 260 for connecting the cathode electrode 230 and the bridge electrode 184 is further formed on the overcoat layer 192. The auxiliary electrode 260 may be disposed in the auxiliary electrode contact part CA of the non-light emitting area NEA, may be made of the same material as the anode electrode 210, and may be formed in the same process. The auxiliary electrode 260 may be connected to the bridge electrode 184 through a second via hole VIA2 which passes through the overcoat layer 192 and the passivation layer 191.

A bank 250 may be formed on the overcoat layer 192. The bank 250 may be formed to expose some regions of the anode electrode 210, for example, a central region and to cover the remaining region, for example, edges of the anode electrode 210. The exposed region of the anode electrode 210, which is not covered by the bank 250, can be defined as the light emitting area EA of the sub-pixel PX. In the non-light emitting area NEA, the bank 250 may be formed to expose a region of the auxiliary electrode 260.

In the aspect, the bank 250 may have a structure in which a hydrophilic bank 251 and a hydrophobic bank 252 are stacked.

The hydrophilic bank 251 may be formed to expose the central regions of the anode electrode 210 and an auxiliary anode electrode 212 and cover the edges. The exposed region of the anode electrode 210, which is not covered by the hydrophilic bank 251, may be defined as the light emitting area EA. The hydrophilic bank 251 is made of a hydrophilic inorganic insulating material such as silicon oxide (SiO2) and silicon nitride (SiNx), so that a solution spreads well in the formation of the light emitting layer 220, which will be described later.

The hydrophobic bank 252 may be formed in a partial region on the hydrophilic bank 251. The hydrophobic bank 252 may be disposed between pixel rows to partition the pixel rows. The hydrophobic bank 252 is formed such that at least one region, for example, an upper region, has hydrophobicity, thereby preventing color mixing between the pixel rows.

The light emitting layer 220 is formed on the exposed region of the anode electrode 210 surrounded by the bank 250. In the aspect, the light emitting layer 220 may be formed by a solution process. For example, a solution for forming the light emitting layer 220 within the light emitting area EA may be applied. The solution may be manufactured by mixing organic materials constituting the light emitting layer 220 with a solvent. The solution may be jetted to the light emitting area through an inkjet apparatus having a nozzle mounted on an inkjet head. The applied ink is dried to form the light emitting layer 220. In the light emitting layer 220 to be formed through the solution process, the surface of the central region may be lower than the surface of the edge region. However, the aspect is not limited thereto.

In the aspect, a hole transport layer (HTL), a hole injection layer (HIL), or the like may be disposed between the light emitting layer 220 and the anode electrode 210.

The cathode electrode 230 is formed on the light emitting layer 220. The cathode electrode 230 may be formed of a transparent conductive material (TCO) or a semi-transmissive conductive material which is capable of transmitting light.

An organic layer 240 may be disposed between the cathode electrode 230 and the light emitting layer 220. The organic layer 240 may be, for example, an electron injection layer (EIL) and/or an electron transport layer (ETL). The organic layer 240 serves to smoothly transfer electrons injected from the cathode electrode 230 to the light emitting layer 220.

The organic layer 240 and the cathode electrode 230 may be widely formed on the display panel 1000. In the light emitting area EA, the organic layer 240 and the cathode electrode 230 may be sequentially stacked on the anode electrode 210 and the light emitting layer 220. In the auxiliary electrode contact part CA, the organic layer 240 and the cathode electrode 230 may be sequentially stacked on the auxiliary electrode 260. The cathode electrode 230 may be connected to the power line to which low potential driving power is applied via the auxiliary electrode 260, the bridge electrode 184, and the auxiliary wiring 122.

An encapsulation layer 300 may be formed on the cathode electrode 230. The encapsulation layer 300 serves to prevent external moisture from penetrating into the light emitting layer 220. The encapsulation layer 300 may be formed of an inorganic insulating material or may have a structure in which an inorganic insulating material and an organic insulating material are alternately stacked, and is not limited thereto.

Figure 4:
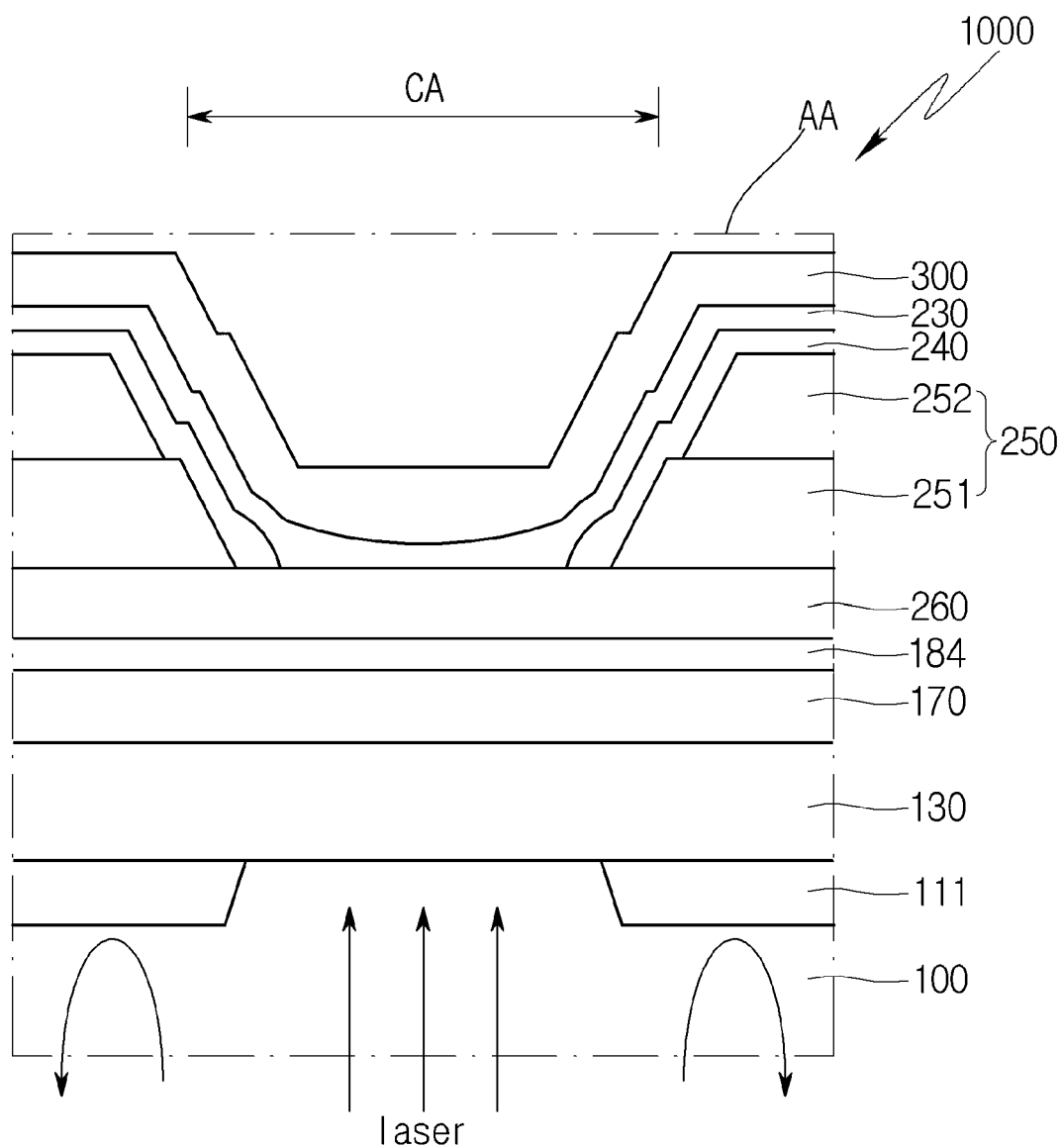
FIG. 4 is a schematic view describing a reflow process in forming an auxiliary electrode contact part shown in FIG. 3.
Figure 5:
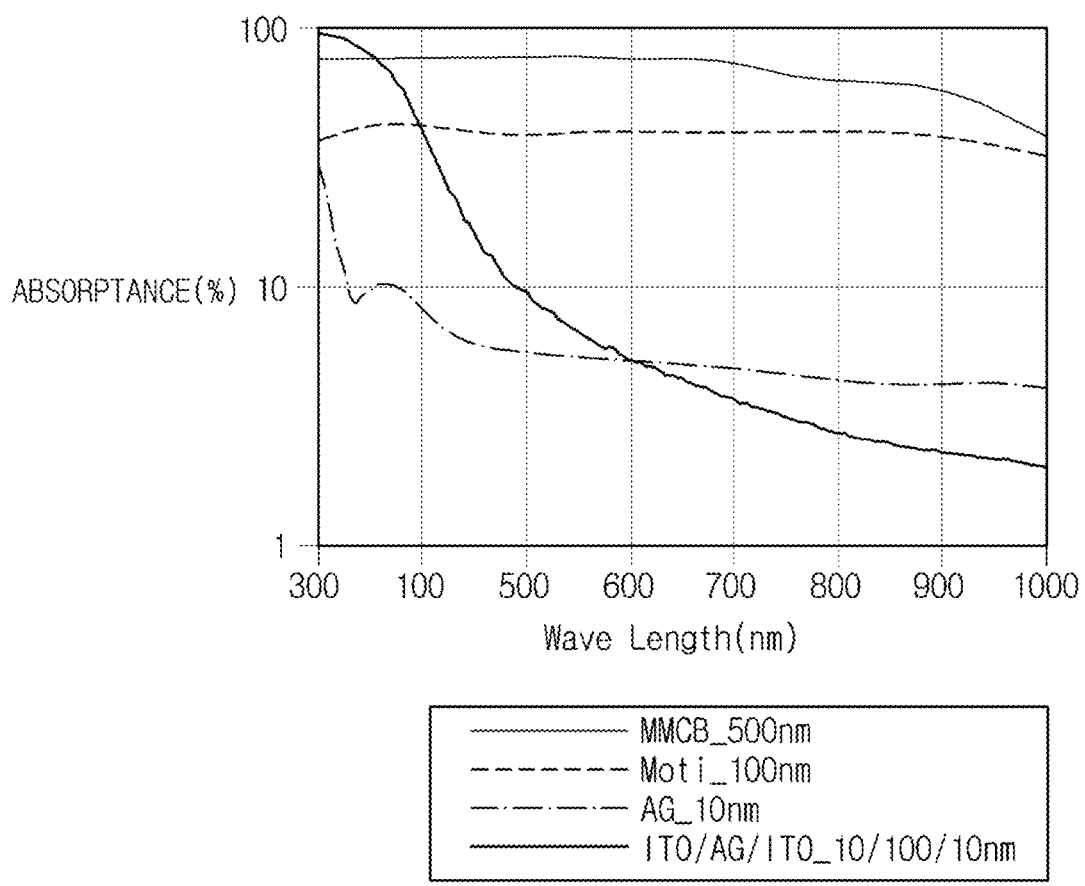
FIG. 5 is a graph showing a light absorptance according to a material of a reflective layer.

FIG. 4 is a view for describing the reflow process for the auxiliary electrode contact part shown in FIG. 3. FIG. 5 is a graph showing a light absorptance according to a material of the reflective layer.

When the organic layer 240 is interposed between the cathode electrode 230 and the auxiliary electrode 260, an electrical resistance between the cathode electrode 230 and the auxiliary electrode 260 may increase. In order to prevent this, a reflow process of irradiating a laser to the auxiliary electrode contact part CA can be applied.

Other components may be damaged by the laser irradiated during the reflow process. In order to prevent this problem, the laser should be selectively irradiated only to the auxiliary electrode contact part CA. This may increase the complexity and error rate of the manufacturing process of the display panel 1000.

In this aspect, the above-described problem is solved through the reflective layers 111 respectively disposed in the concave portions P1 of the substrate 100. Specifically, as shown in FIG. 4, laser may be irradiated to the entire rear surface of the display panel 1000 during the reflow process.

Here, a portion of the laser may pass through the opening OPN1 between the reflective layers 111 and reach the auxiliary electrode 260 within the auxiliary electrode contact part CA. The auxiliary electrode 260 absorbs the energy of the laser and transfers it to the organic layer 240. The organic layer 240 which has received the energy may be partially or entirely melted. As the melted organic layer 240 flows, at least an upper region of the auxiliary electrode 260 may be exposed. In the exposed region, the auxiliary electrode 260 can be in direct contact with the cathode electrode 230 thereover.

The remaining portion of the laser may be reflected by the reflective layer 111 and radiated to the outside. Accordingly, the laser is not transmitted to the devices disposed in the remaining regions other than the auxiliary electrode contact part CA. As a result, even when the laser is irradiated to the entire display panel 1000 during the reflow process, the devices disposed in the display panel 1000 can be prevented from being damaged, and the complexity and difficulty of the process can be reduced.

Referring to FIG. 5, in the case of a metal film made of MMCB (highly durable Nb-based material) and molybdenum titanium (MoTi), the metal film has a high light absorptance in a target wavelength band. In the case of a 10 nm thick metal film made of silver (Ag), it has a low light absorptance in a wavelength band of about 350 nm or more. In the case of a metal film composed of a triple layer of indium tin oxide (ITO)/silver/ITO, it has a low light absorptance in a wavelength band of about 500 nm or more. The lower the light absorptance, the higher the light reflectance. Therefore, the reflective layer 111 may be formed of silver or a multilayer including silver. A light wavelength of laser which is used in the reflow process to be described later may be selected according to the material of the reflective layer 111.

Figure 6:
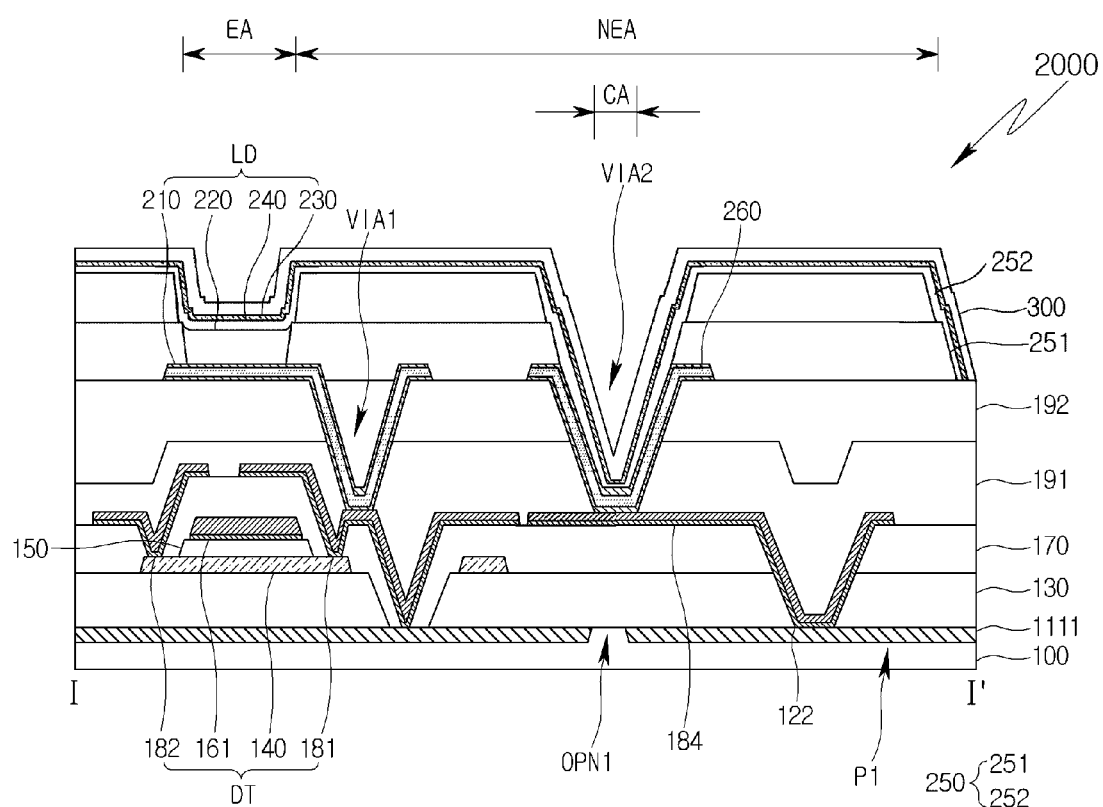
FIG. 6 is a schematic cross-sectional view of a display panel according to a second aspect of the present disclosure.

FIG. 6 is a schematic cross-sectional view of a display panel 2000 according to a second aspect.

In comparison with the first aspect shown in FIG. 2, in the second aspect, the first conductive layer is omitted. That is, the light shielding layer 121 and the auxiliary wiring 122 are omitted on the substrate 100. Instead, reflective layers 1111 may function as the light shielding layer 121 and the auxiliary wiring 122.

Since the reflective layer 1111 can be made of a metal that blocks outside light, the reflective layer 1111 disposed to overlap with the channel of the active layer 140 on a plane is able to function as the light shielding layer 121.

Also, the reflective layer 1111 may be connected to power wiring to which the low potential driving power is applied, and the bridge electrode 184 may be connected to the corresponding reflective layer 1111 through a contact hole which passes through the interlayer insulating layer 170 and the buffer layer 130. Accordingly, the reflective layer 1111 can function as the auxiliary wiring 122.

The above-described omission of the first conductive layer is able to simplify the manufacturing process of the display panel 1000 and to reduce the manufacturing cost of the display panel 1000.

Figure 7:
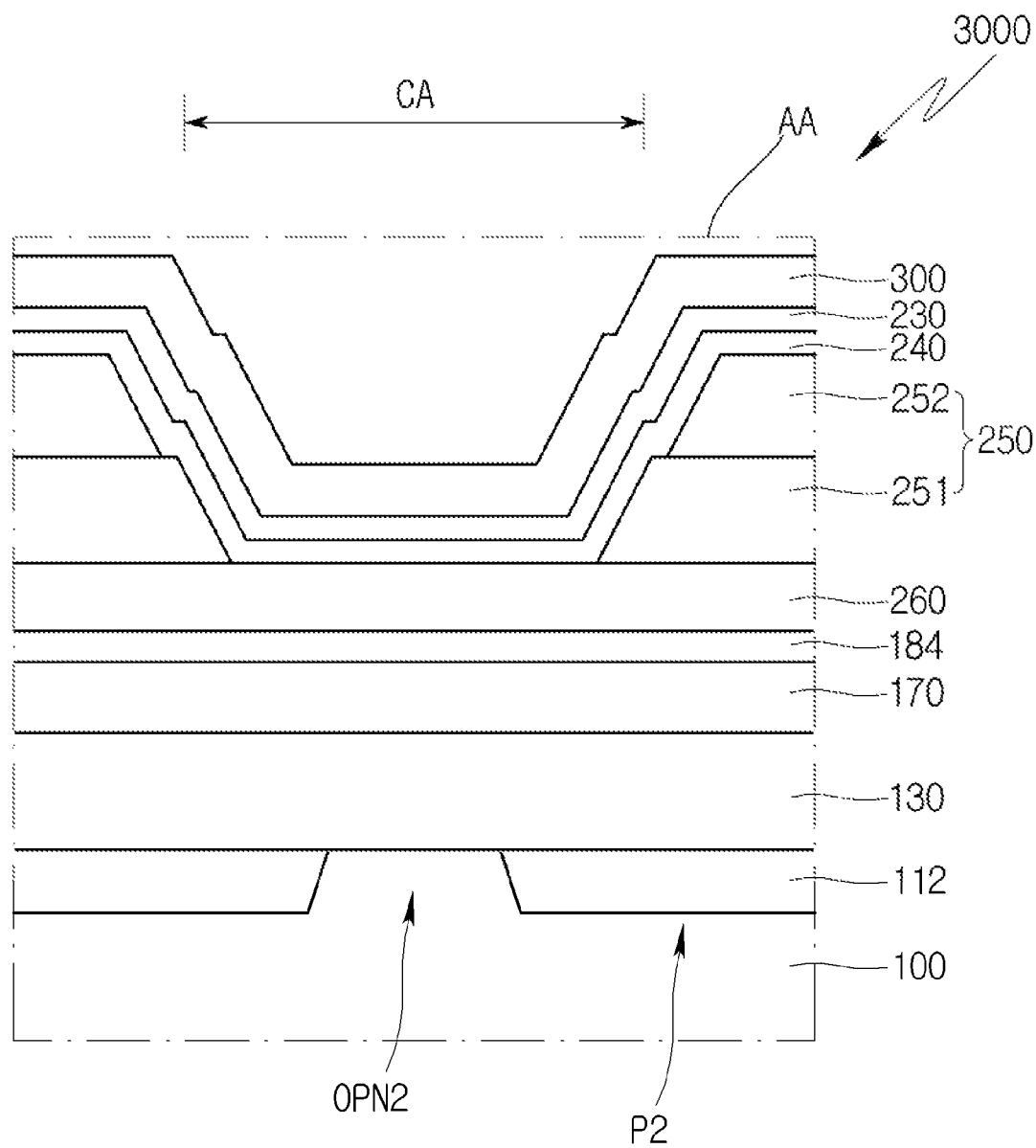
FIG. 7 is an enlarged view of area "AA" of FIG. 2 according to a third aspect of the present disclosure.
Figure 8:
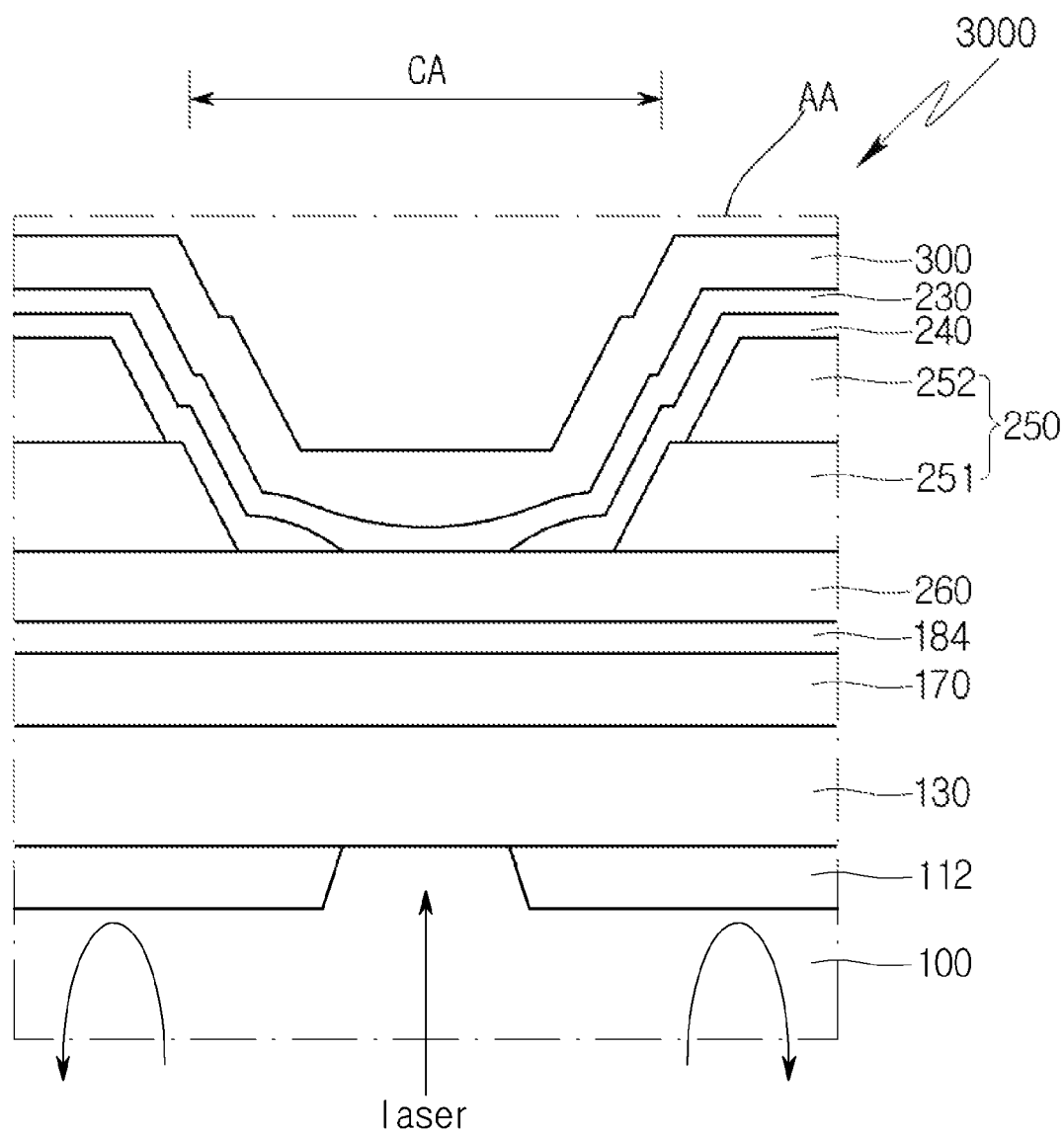
FIG. 8 is a schematic view describing a reflow process in forming an auxiliary electrode contact part shown in FIG. 7.

FIG. 7 is an enlarged view of area "AA" of FIG. 2 according to a third aspect of the present disclosure. Here, FIG. 7 is an enlarged view of area "AA" corresponding to the auxiliary electrode contact part CA. Since there is a difference only in the auxiliary electrode contact part CA compared to FIG. 2, only the area "AA" is shown and described. FIG. 8 is a view describing the reflow process for the auxiliary electrode contact part CA shown in FIG. 7.

As in the first aspect, when the entire organic layer 240 is melted in the reflow process, the organic layer 240 flows non-uniformly, so that the auxiliary electrode 260 is not exposed or unstable contact between the cathode electrode 230 and the auxiliary electrode 260 may be made.

In order to solve this problem, in the third aspect, concave portions P2 are, as shown in FIG. 7, formed in regions other than a portion of regions overlapping with the auxiliary electrode contact part CA.

As in the concave portions P2, each of the reflective layers 112 is disposed to overlap with at least one region of the auxiliary electrode contact part CA. In this aspect, an opening OPN2 filled with the substrate 100 is formed between the reflective layers 112. In particular, in the aspect, the end of the reflective layer 112 further protrudes to the auxiliary electrode contact part CA. The opening OPN2 overlaps with a region of the auxiliary electrode contact part CA, and the width of the opening OPN2 is smaller than the width of the auxiliary electrode contact part CA. Another conductive layer is not interposed between the substrate 100 and the auxiliary electrode 260 in the region where the opening OPN2 is formed.

As shown in FIG. 8, laser may be irradiated to the entire rear surface of the display panel 1000 during the reflow process. Here, a portion of the laser may pass through the opening OPN2 between the reflective layers 112 and reach the auxiliary electrode 260 within the auxiliary electrode contact part CA. The auxiliary electrode 260 absorbs the energy of the laser and transfers it to the organic layer 240.

Within the auxiliary electrode contact part CA, only a portion of the organic layer 240, which receives the energy of the laser through the opening OPN2 may be selectively melted. For example, the central region of the organic layer 240, which overlaps with the opening OPN2, may be melted and the edge region of the organic layer 240 may not be melted. However, the aspect is not limited thereto.

By tension with peripheral regions of the organic layer 240, which are not melted, the melted region of the organic layer 240 flows to the peripheral region. For example, the melted organic layer 240 may flow to the edge region on the auxiliary electrode 260. Then, an upper portion of the central region of the auxiliary electrode 260 may be exposed without being covered by the organic layer 240. In the exposed region, the auxiliary electrode 260 may directly contact the cathode electrode 230 thereover.

In the third aspect as described above, the organic layer 240 is selectively melted between the regions overlapping with the reflective layer 112 and the regions not overlapping with the reflective layer 112. Accordingly, the organic layer 240 can be efficiently induced to flow in a specific direction through the tension between the melted region and the region which is not melted. As the flow of the organic layer 240 is easily induced, contact between the auxiliary electrode 260 and the cathode electrode 230 can be stably made.

Figure 9:
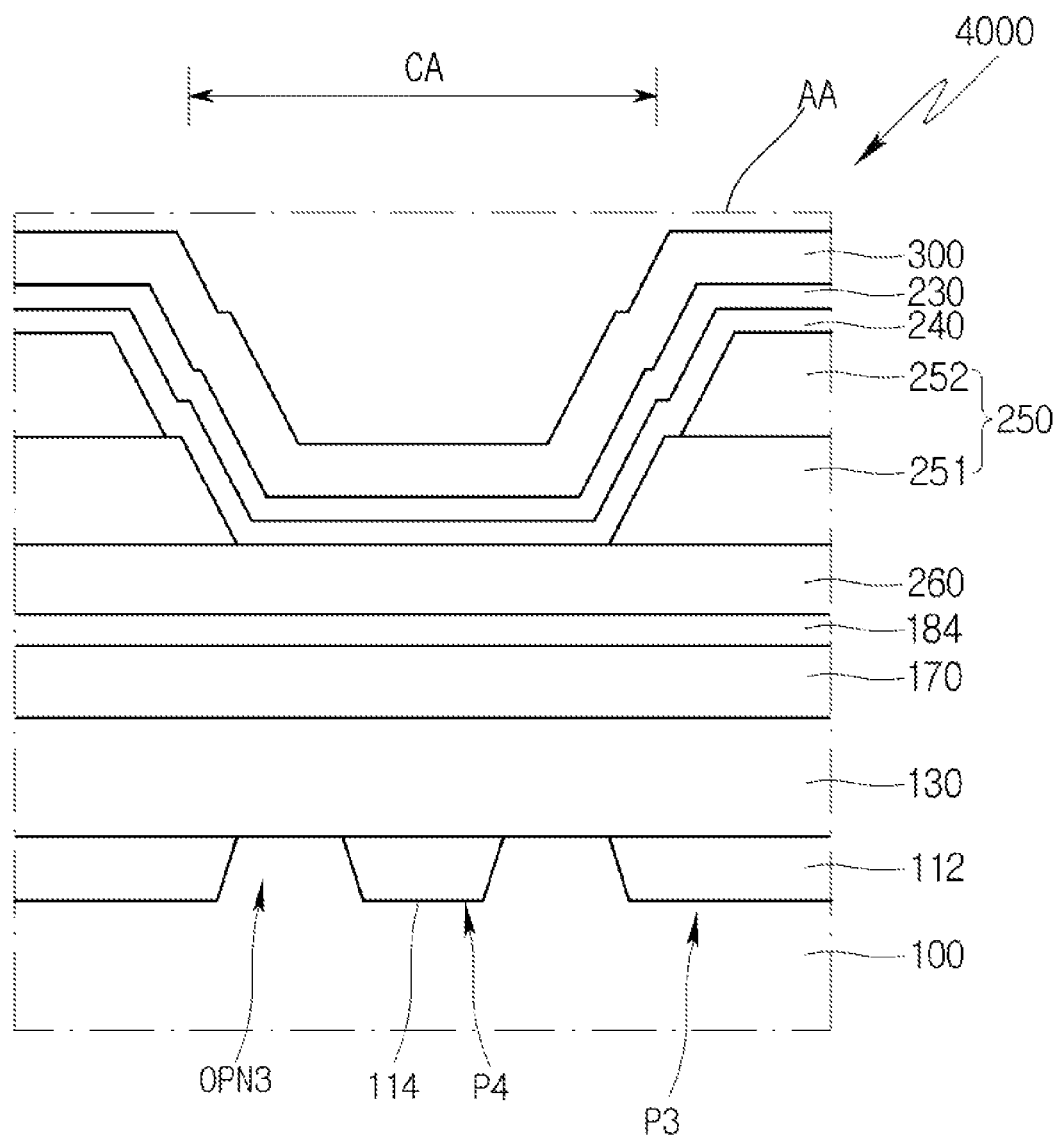
FIG. 9 is an enlarged view of area "AA" of FIG. 2 according to a fourth aspect of the present disclosure.
Figure 10:
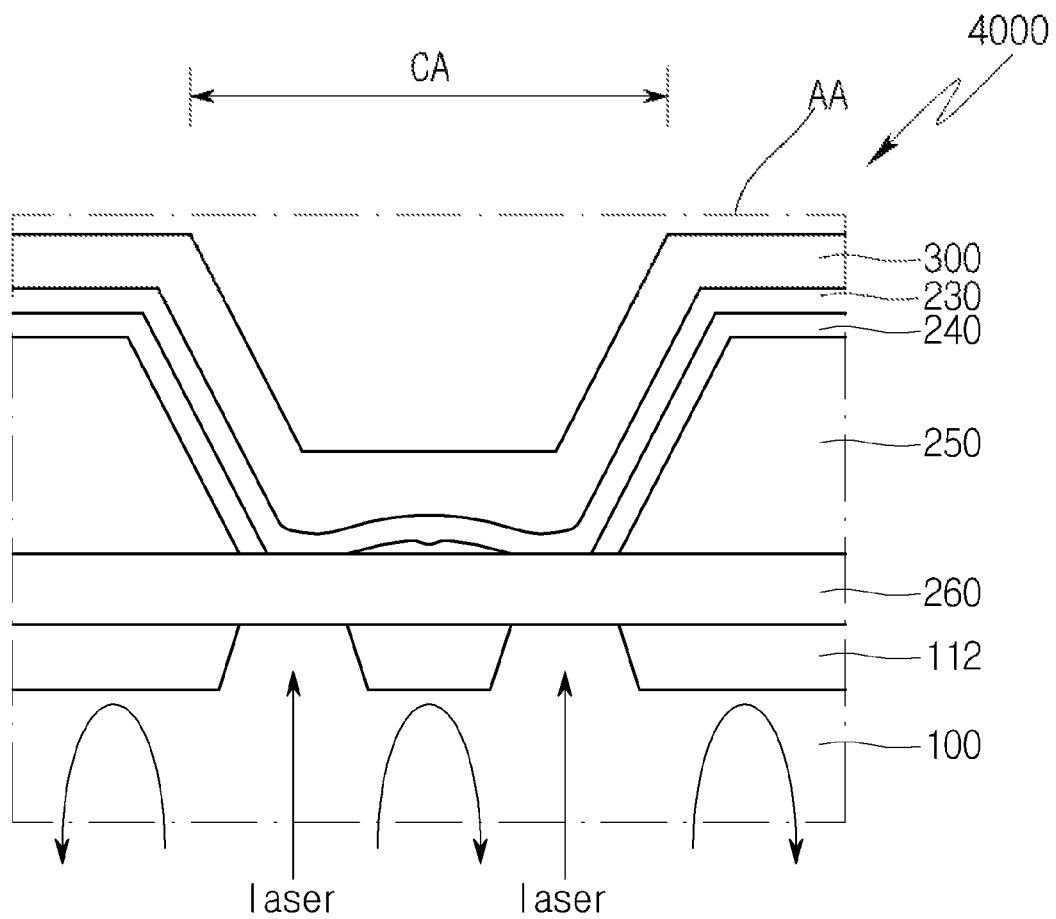
FIG. 10 is a schematic view describing a reflow process in forming an auxiliary electrode contact part shown in FIG. 9.

FIG. 9 is an enlarged view of area "AA" of FIG. 2 according to a fourth aspect. Here, FIG. 9 is an enlarged view of the area "AA" corresponding to the auxiliary electrode contact part CA. Since there is a difference only in the auxiliary electrode contact part CA compared to FIG. 2, only the area "AA" is shown and described. FIG. 10 is a view for describing the reflow process for the auxiliary electrode contact part CA shown in FIG. 9.

In the fourth aspect, the substrate 100 may include, as shown in FIG. 9, a plurality of first concave portions P3 and a plurality of second concave portions P4.

The first concave portions P3 are formed in regions other than regions overlapping with the auxiliary electrode contact part CA. That is, the first concave portions P3 may be entirely formed on the substrate 100 in such a way as not to overlap with the auxiliary electrode contact part CA. In this aspect, a spaced distance between the first concave portions P3 is the same as or similar to the width of the auxiliary electrode contact part CA.

The second concave portions P4 are disposed to overlap with a region of the auxiliary electrode contact part CA. In other words, the second concave portions P4 may be disposed between the first concave portions P3. In the aspect, the second concave portions P4 may be disposed to overlap with the central region of the auxiliary electrode contact part CA.

The reflective layers 112 and 114 are disposed in the concave portions P3 and P4, respectively. As in the first concave portions P3, the first reflective layers 112 are disposed in such a way as not to overlap with the auxiliary electrode contact part CA. As in the second concave portions P4, the second reflective layers 114 are disposed to overlap with a region of the auxiliary electrode contact part CA. That is, the second reflective layers 114 may be disposed between the first reflective layers 112.

In this aspect, an opening OPN3 filled with the substrate 100 is formed between the first reflective layers 112 and the second reflective layers 114. The opening OPN3 overlap with a region of the auxiliary electrode contact part CA. For example, the opening OPN3 may overlap with an edge region of the auxiliary electrode contact part CA. Another conductive layer is not interposed between the substrate 100 and the auxiliary electrode 260 in the region where the opening OPN3 is formed.

As shown in FIG. 10, laser may be irradiated to the entire rear surface of the display panel 1000 during the reflow process. Here, a portion of the laser may pass through the opening OPN3 between the reflective layers 112 and 114 and reach the auxiliary electrode 260 within the auxiliary electrode contact part CA. The auxiliary electrode 260 absorbs the energy of the laser and transfers it to the organic layer 240.

Within the auxiliary electrode contact part CA, only a portion of the organic layer 240, which receives the energy of the laser through the opening OPN3 may be selectively melted. For example, the edge region of the organic layer 240, which overlaps with the opening OPN3, may be melted and the central region of the organic layer 240 may not be melted. However, the aspect is not limited thereto.

By tension with peripheral regions of the organic layer 240, which are not melted, the melted region of the organic layer 240 flows to the peripheral region. For example, the melted organic layer 240 may flow to the central region on the auxiliary electrode 260. Then, an upper portion of the edge region of the auxiliary electrode 260 may be exposed without being covered by the organic layer 240. In the exposed region, the auxiliary electrode 260 may directly contact the cathode electrode 230 thereover.

FIGS. 11 to 15 show a manufacturing method of the display panel according to the aspect. Hereinafter, the manufacturing method of the display panel will be described with reference to the second aspect shown in FIG. 6.

Figure 11:
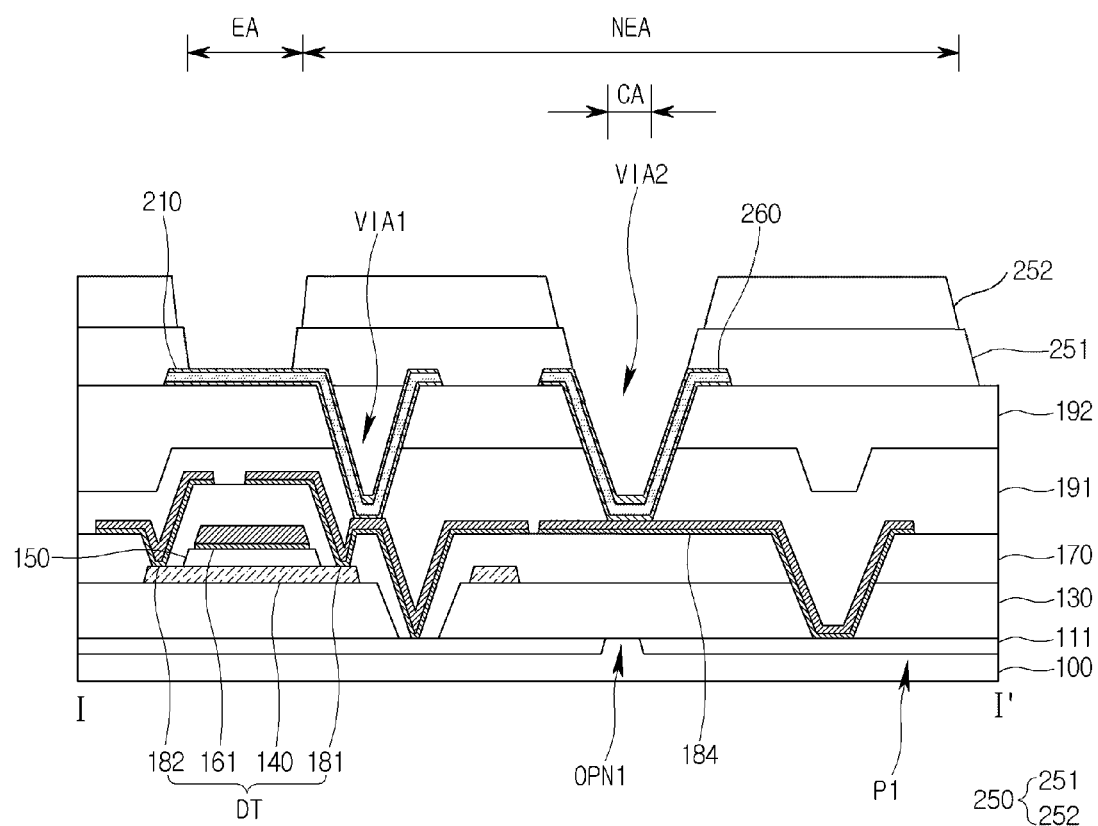
FIGS. 11 to 15 show a manufacturing method of the display panel according to the present disclosure.

Referring to FIG. 11, first, the circuit element layer may be formed on the substrate 100. Specifically, a plurality of the concave portions P2 are formed on the substrate 100. The concave portions P2 are formed in regions other than regions overlapping with the auxiliary electrode contact part CA. That is, the concave portions P2 may be entirely formed on the substrate 100 in such a way as not to overlap with the auxiliary electrode contact part CA. A distance between the concave portions P2 may be determined to be the same as or similar to the width of the auxiliary electrode contact part CA to be formed later.

The reflective layer 111 is disposed within the concave portions P2, respectively. Through this process, the opening OPN1 filled with the substrate 100 is formed between the reflective layers 111. The opening OPN1 overlaps with the auxiliary electrode contact part CA, and the width of the opening OPN1 is the same as or similar to the width of the auxiliary electrode contact part CA. In the aspect, the reflective layer 111 may be formed of silver or a multilayer including silver.

The buffer layer 130 is formed on the substrate 100, and the first to third conductive layers, the passivation layer 191, and the overcoat layer 192 are further formed. Also, the anode electrode 210 is formed on the overcoat layer 192 in the light emitting area EA, and the auxiliary electrode 260 is formed on the overcoat layer 192 in the auxiliary electrode contact part CA of the non-light emitting area NEA. The auxiliary electrode 260 is connected to the bridge electrode 184.

The bank 250 is formed on the overcoat layer 192. The bank 250 may be formed to expose the central region of the anode electrode 210 and to cover the edge region. Also, the bank 250 may be formed to expose the central region of the auxiliary electrode 260 and to cover the edge region.

At least a portion of the surface of the bank 250 may be formed to have hydrophobicity. For example, the bank 250 may be formed by applying a solution in which a hydrophobic material such as fluorine (F) is mixed with an organic insulating material and then by a photolithography process. The hydrophobic material such as fluorine can move to the top of the bank 250 by light irradiated during the photolithography process, and accordingly, the top surface of the bank 250 may have a hydrophobic property and the remaining portion may have a hydrophilic property. When the light emitting layer 220 is formed through a solution process, the hydrophobic bank 250 can serve as a dam to prevent ink from being mixed between the light emitting areas EA.

Figure 12:
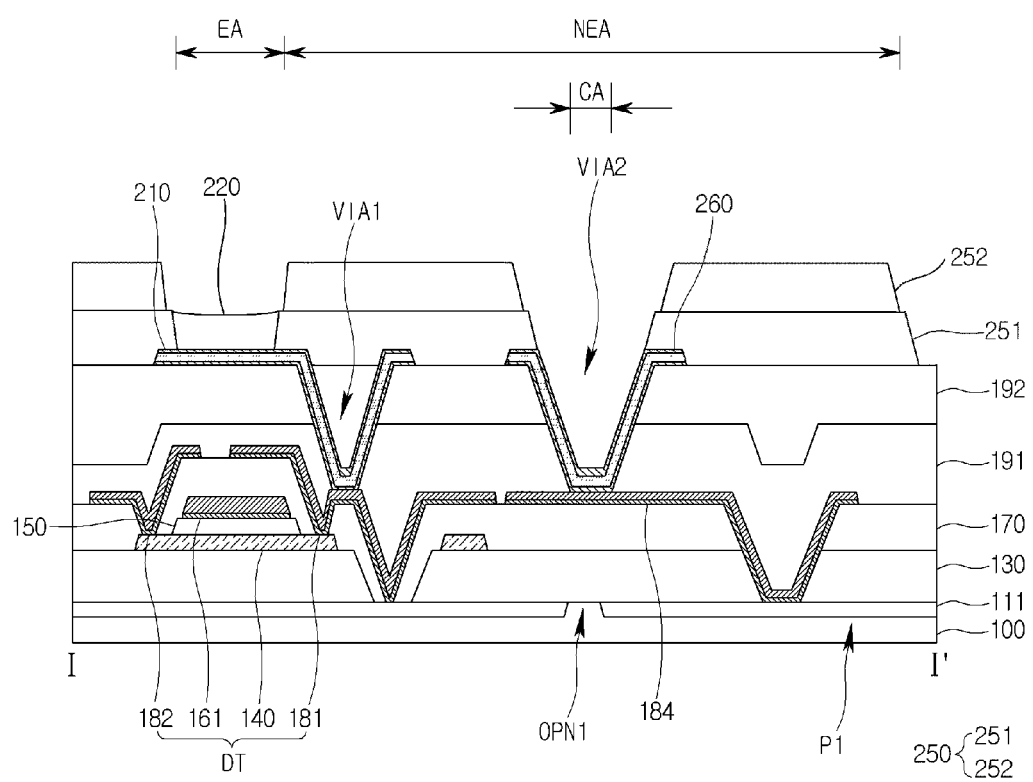

Then, as shown in FIG. 12, the light emitting layer 220 is formed. The light emitting layer 220 is formed on the anode electrode 210 in the light emitting area EA defined by the bank 250.

In the aspect, the light emitting layer 220 may be formed through a solution process. For example, a solution for forming the light emitting layer 220 within the light emitting area EA may be applied. The solution may be manufactured by mixing organic materials constituting the light emitting layer 220 with a solvent. The solution may be jetted to the light emitting area through an inkjet apparatus having a nozzle mounted on an inkjet head. The applied ink is dried to form the light emitting layer 220. In the light emitting layer 220 to be formed through the solution process, the surface of the central region may be lower than the surface of the edge region. However, the aspect is not limited thereto.

Figure 13:
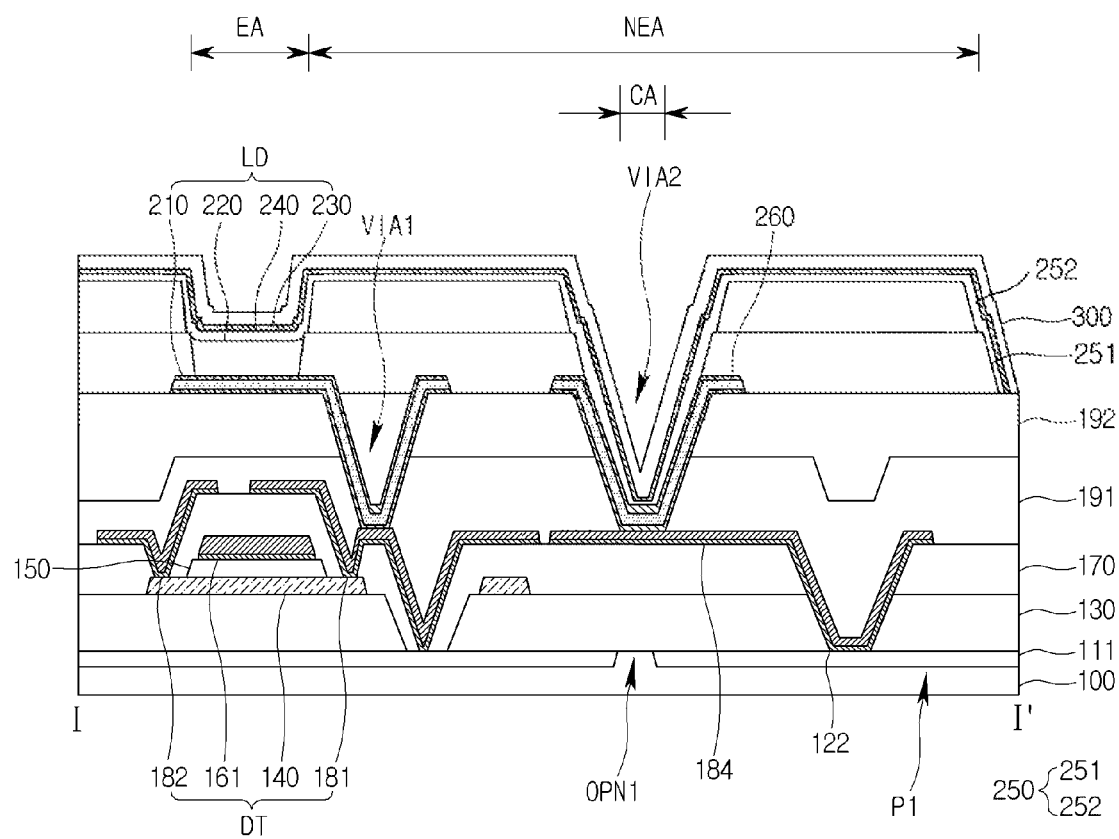

Thereafter, an organic layer is formed as shown in FIG. 13. The organic layer may be the organic layer 240. The cathode electrode 230 is formed on the organic layer 240. The organic layer 240 and the cathode electrode 230 may be widely formed on the display panel 1000 to cover the bank 250 and the auxiliary electrode 260. The organic layer 240 and the cathode electrode 230 may be formed by an evaporation deposition method such as thermal deposition or by a physical vapor deposition method such as a sputtering method.

Figure 14:
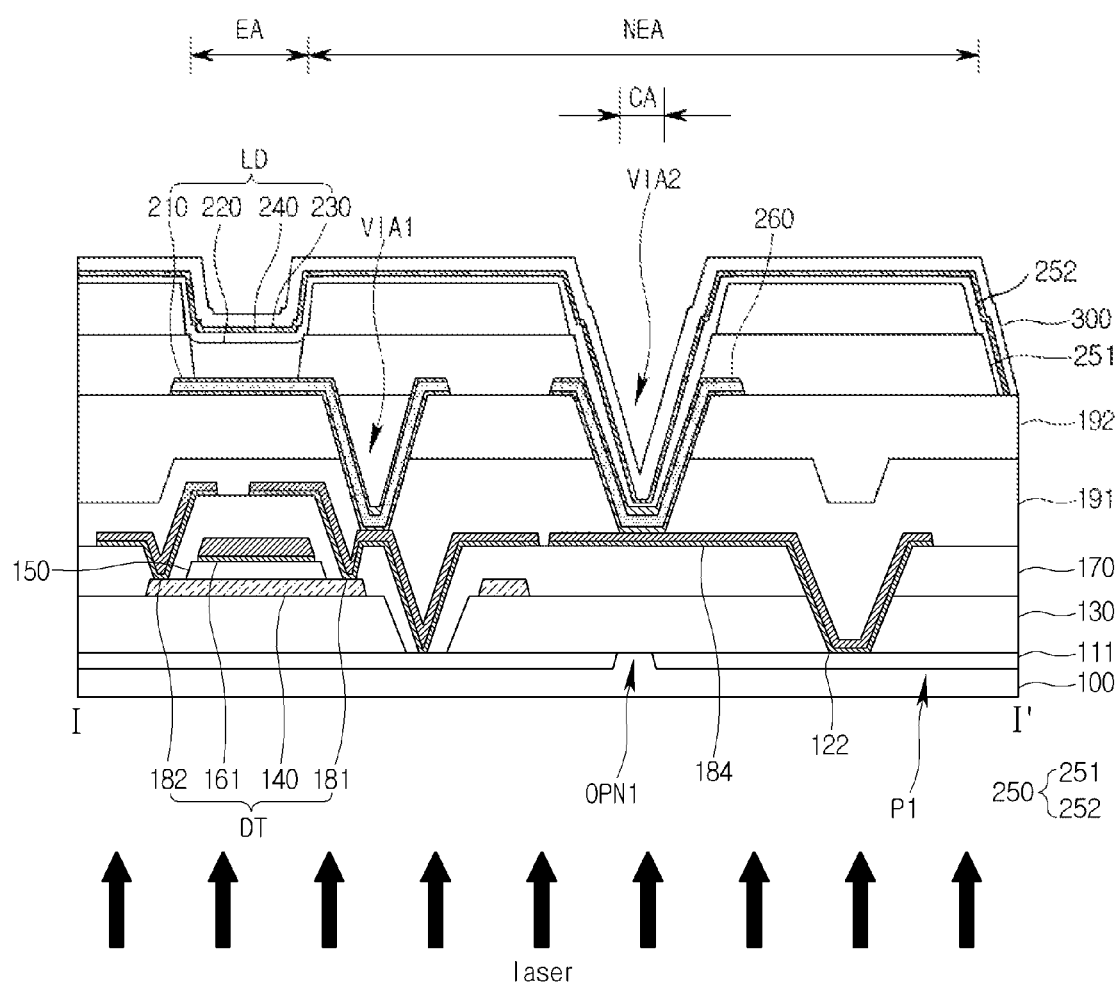

Then, a reflow process for the organic layer 240 may be performed. For example, as shown in FIG. 14, laser may be irradiated from below the display panel 1000. Here, the laser is irradiated to the entire rear surface of the display panel 1000.

A portion of the irradiated laser is reflected by the reflective layers 111 and radiated to the outside. Another portion of the irradiated laser passes through the opening OPN1 between the reflective layers 111 and reaches the auxiliary electrode 260. The energy of the laser which has reached the auxiliary electrode 260 may be transferred to the organic layer 240 stacked on the auxiliary electrode 260.

At least a portion of the organic layer 240 is melted by the energy of the laser. As the melted organic layer 240 flows, at least an upper region of the auxiliary electrode 260 may be exposed.

Figure 15:
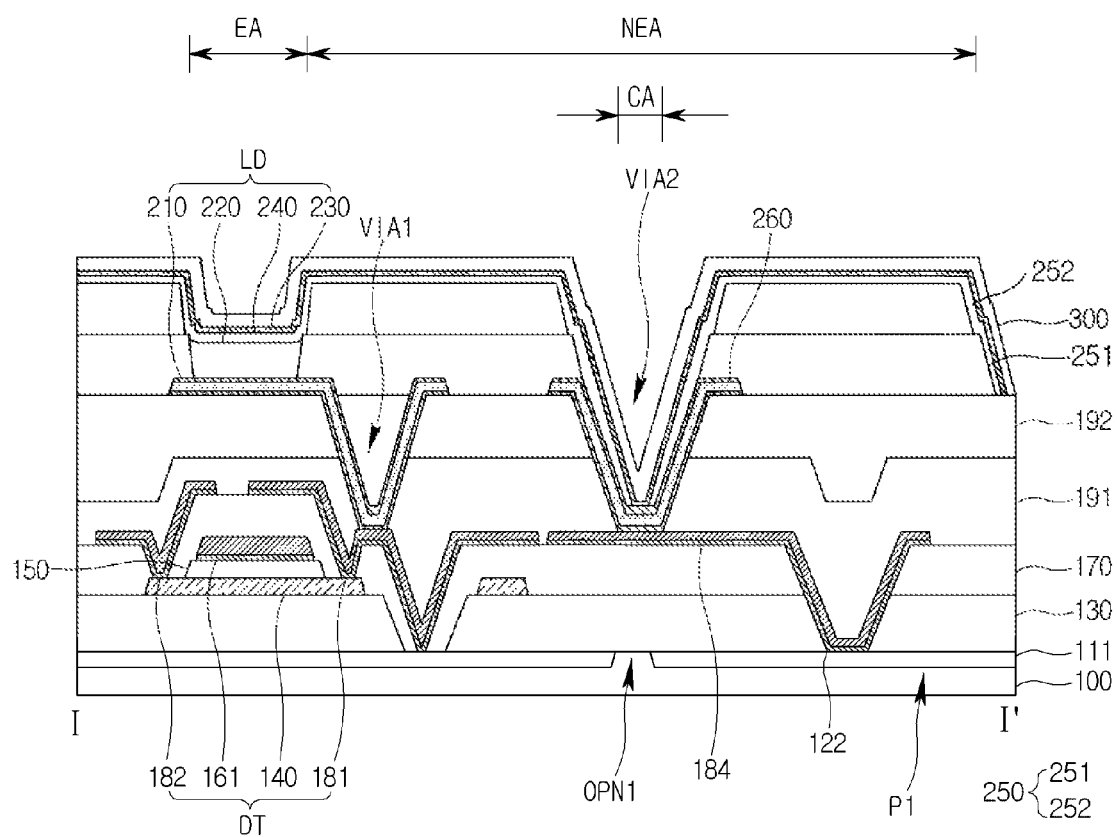

After the reflow process, as shown in FIG. 15, the auxiliary electrode 260 may directly contact the cathode electrode 230 in the exposed region where the organic layer 240 is not formed.

As described above, only a portion of the laser irradiated to the entire surface of the display panel 1000 through the opening(s) in the reflective layer 111 can be selectively transmitted to the auxiliary electrode contact part CA. Accordingly, damages on the peripheral devices due to the entire surface laser irradiation during the reflow process can be prevented. According to the present disclosure, the laser can be irradiated to the entire display panel 1000, thereby reducing the complexity and difficulty of the process.

The display panel and the method of manufacturing the same according to the aspects reduce resistance between the cathode electrode and the auxiliary electrode, so that electric power which is applied through an auxiliary wiring is stably supplied to the cathode electrode.

The display panel and the method of manufacturing the same according to the exemplary aspects allow an organic layer to be selectively melted even when a laser beam is irradiated to the entire surface of the display panel during a reflow process, thereby overcoming limitations of laser equipment and making it easier to manufacture a large-area display device.

The display panel and the method of manufacturing the same according to the aspects may reduce an error rate in the reflow process by stabilizing connection between the cathode electrode and the auxiliary electrode.

It can be understood by those skilled in the art that the aspects can be embodied in other specific forms without departing from its spirit or essential characteristics. Therefore, the foregoing aspects and advantages are merely exemplary and are not to be construed as limiting the present disclosure. It can be understood by those skilled in the art that the aspects can be embodied in other specific forms without departing from its spirit or essential characteristics. Therefore, the foregoing aspects and advantages are merely exemplary and are not to be construed as limiting the present disclosure. The scopes of the aspects are described by the scopes of the following claims rather than by the foregoing description. All modification, alternatives, and variations derived from the scope and the meaning of the scope of the claims and equivalents of the claims should be construed as being included in the scopes of the aspects.

What is claimed is:

1. A display device comprising:
a light emitting area, an auxiliary electrode contact part and a plurality of concave portions disposed over a substrate;
a plurality of reflective layers disposed in the plurality of concave portions;
an anode electrode overlapping with the light emitting area;
an auxiliary electrode overlapping with the auxiliary electrode contact part and connected to a low potential driving power;
a bank covering an edge portion of the anode electrode and the auxiliary electrode;
a light emitting layer disposed on a region of the anode electrode, which is not covered by the bank, and in which a surface of an edge portion adjacent to the bank is higher than a surface of a central region;
an organic layer covering the auxiliary electrode; and
a cathode electrode disposed on the light emitting layer and the organic layer and in direct contact with the auxiliary electrode in the auxiliary electrode contact part;
a plurality of reflective layers disposed on the substrate and having at least one opening,
wherein the at least one opening is filled with the substrate and overlaps with the auxiliary electrode contact part.

2. The display device of claim 1, wherein the plurality of concave portions and the plurality of reflective layers do not overlap with the auxiliary electrode contact part, and
wherein a width of the opening is the same as a width of the auxiliary electrode contact part.

3. The display device of claim 1, wherein the plurality of concave portions and the plurality of reflective layers overlap with the auxiliary electrode contact part, and
wherein a width of the opening is smaller than a width of the auxiliary electrode contact part.

4. The display device of claim 3, wherein the cathode electrode is in direct contact with a central region of the auxiliary electrode.

5. The display device of claim 1, wherein the plurality of concave portions comprise:
first concave portions not overlapping with the auxiliary electrode contact part; and
second concave portions disposed between the first concave portions and overlapping with the auxiliary electrode contact part, and
wherein the plurality of reflective layers comprise:
first reflective layers disposed within the first concave portions; and
second reflective layers disposed within the second concave portions.

6. The display device of claim 5, wherein the cathode electrode is in direct contact with an edge region of the auxiliary electrode.

7. The display device of claim 1, further comprising:
a buffer layer covering the plurality of reflective layers;
at least one transistor disposed on the buffer layer; and
an overcoat layer covering the at least one transistor where the auxiliary electrode is disposed.

8. The display device of claim 7, further comprising a light shielding layer interposed between the substrate and the buffer layer and overlapping with the at least one transistor.

9. The display device of claim 1, wherein an interposed area between the at least one opening and the auxiliary electrode has no conductive layer.

10. The display device of claim 1, wherein the reflective layer is formed of at least one layer including silver.

11. A manufacturing method of the display device, the manufacturing method comprising:
forming a plurality of concave portions on a substrate where an auxiliary electrode contact part is defined;
forming a plurality of reflective layers in the plurality of concave portions;
forming an auxiliary electrode overlapping with the auxiliary electrode contact part and connected to a low potential driving power;
forming an organic layer covering the auxiliary electrode;
forming a cathode electrode on the organic layer; and
performing a reflow process by irradiating laser to an entire rear surface of the substrate,
wherein the at least one opening is filled with the substrate and overlaps with the auxiliary electrode contact part.

12. The manufacturing method of claim 11, wherein one portion of the laser is reflected by the plurality of reflective layers and another portion of the laser passes through the at least one opening and reaches the auxiliary electrode.

13. The manufacturing method of claim 12, wherein a portion of the organic layer is melted by an energy of the laser which is transferred through the auxiliary electrode, and the melted organic layer flows on the auxiliary electrode.

14. The manufacturing method of claim 13, wherein the at least one opening overlaps with a central region of the auxiliary electrode, and
wherein the melted organic layer flows to an edge region on the auxiliary electrode.

15. The manufacturing method of claim 14, wherein an upper portion of the central region of the auxiliary electrode is exposed by the flow of the organic layer, and
wherein the cathode electrode is in direct contact with the exposed upper central region of the auxiliary electrode.

16. The manufacturing method of claim 13, wherein the at least one opening overlaps with an edge region of the auxiliary electrode, and
wherein the melted organic layer flows to a central region on the auxiliary electrode.

17. The manufacturing method of claim 16, wherein an upper portion of the edge region of the auxiliary electrode is exposed by the flow of the organic layer, and
wherein the cathode electrode is in direct contact with the exposed upper portion of the edge region of the auxiliary electrode.

18. The manufacturing method of claim 11, further comprising, after the forming the plurality of reflective layers,
forming a buffer layer covering the plurality of reflective layers;
forming at least one transistor on the buffer layer; and
forming an overcoat layer covering the at least one transistor.

19. The manufacturing method of claim 18, further comprising, before the forming the buffer layer, forming a light shielding layer overlapping with the at least one transistor.

20. The manufacturing method of claim 11, wherein the reflective layer is formed of at least one layer including silver.

* * * * *